(12) United States Patent
Remsburg

(10) Patent No.: US 6,330,155 B1
(45) Date of Patent: Dec. 11, 2001

(54) METHOD AND APPARATUS FOR TEMPERATURE CONTROL OF ELECTRICAL DEVICES MOUNTED ON CIRCUIT BOARDS

(75) Inventor: Ralph Remsburg, Juno Beach, FL (US)

(73) Assignee: Qtera Corporation, Boca Raton, FL (US)

( * ) Notice: Subject to any disclaimer, the term of this patent is extended or adjusted under 35 U.S.C. 154(b) by 0 days.

(21) Appl. No.: 09/537,204

(22) Filed: Mar. 28, 2000

(51) Int. Cl.[7] .................................................. H05K 7/20
(52) U.S. Cl. .................... 361/695; 165/80.3; 165/276; 236/49.5; 454/184
(58) Field of Search ................... 165/80.3, 276; 62/259.2; 236/49.1, 49.5; 361/688, 690, 694–695, 729, 796; 454/184, 353

(56) References Cited

U.S. PATENT DOCUMENTS

| 4,629,114 | 12/1986 | Baker ...................................... 236/11 |
| 4,739,444 | 4/1988 | Zashi et al. ........................... 361/383 |
| 5,101,320 | 3/1992 | Bhargava et al. .................... 361/384 |
| 5,769,159 | 6/1998 | Yun ....................................... 165/276 |
| 5,894,407 | 4/1999 | Askalu et al. ........................ 361/695 |
| 5,914,858 | 6/1999 | McKeen et al. ...................... 361/695 |

FOREIGN PATENT DOCUMENTS

| 2076299 | * 3/1990 | (JP) ...................................... 361/694 |

* cited by examiner

Primary Examiner—Gregory Thompson
(74) Attorney, Agent, or Firm—Hunton & Williams

(57) ABSTRACT

An enclosure for electronic equipment is constructed to orient a plurality of circuit boards in series of parallel slots with air-flow channels therebetween. Cooling air is delivered at constant pressure to inlet ends of each of the channels. Each channel is provided with a thermally sensitive air-flow restrictor at its outlet end. Each air-flow channel is thus provided with independent air temperature control. As a result, each circuit board slot can be utilized for a board with varying heat generating and air resistance characteristics. Each board is cooled properly irrespective of its power usage or shape. Additionally, the enclosures can be relocated to different environments having a wide range of ambient temperatures without adversely effecting the operational characteristics of components on the circuit boards.

12 Claims, 2 Drawing Sheets

METHOD AND APPARATUS FOR TEMPERATURE CONTROL OF ELECTRICAL DEVICES MOUNTED ON CIRCUIT BOARDS

FIELD OF THE INVENTION

The invention relates to systems for controlling operating temperatures for electronic devices.

BACKGROUND OF THE INVENTION

Solid state electronic devices are employed in a wide range of manufactured products. The devices are found in aircraft, automobiles, computers, industrial control systems, military systems, home appliances and many other applications. Within this wide range of applications, there is a correspondingly wide range of environmental conditions in which the devices must operate successfully. In particular, there is a wide range of ambient temperatures in which these devices must operate.

In many instances, performance characteristics of electronic devices are temperature dependent. As a result of this temperature dependency, many devices are designed to produce optimum performance within a predefined range of operating temperatures.

Most solid state electronic devices produce heat during their operation. Many of these devices produce varying amounts of heat depending on the functions which they are performing at any moment.

Typically, this varying amount of heat energy is carried away from the device by convection currents of ambient air. For devices which generate large amounts of heat, metallic heat sinks are employed to remove excess heat energy through thermal conduction.

These conventional temperature control measures are usually satisfactory when the devices are operating in ambient conditions that have a narrow range of temperatures. For example, room temperature in an air-conditioned office setting would present ambient temperature conditions which vary no more that a few degrees.

Workers in the prior art have found that these conventional temperature control measures are not sufficient in circumstance where electronic devices are exposed to wide ranging ambient temperature. For example a device used in an aircraft standing on a tarmac runway may be exposed to temperatures in excess 50 ° C. That same device may be exposed to temperature as low as −50 ° C. an hour later when the aircraft is flying at 11,000 meters.

In these extremely wide ranging temperature conditions there is often a need to provide a more sophisticated temperature control for electronic devices. Designers must provide measures for both retaining and removing heat in a device, depending on the ambient temperature in which the device is operating. In other words, devices must be assembled onto mechanisms which have a heat dissipation capability that is variable as a function of ambient temperatures.

This need for sophisticated temperature control has been recognized and addressed in the prior art in a number of ways.

For example, there are thermo-electric cooling devices which employ the so-called Peltier effect. The devices can provide accurate control of operating temperature of a single device. However, this temperature control is not achieved without deleterious side effects. Peltier coolers have very low efficiencies. When a Peltier cooler is used to cool a typical ¼watt laser there is need for power input of about 4 watts into the cooler. Consequently, an assembly of electronic devices which are cooled with Peltier coolers presents an overall cooling requirement that may be as much as sixteen times as great that needed for the actual electronic devices.

Also, within the prior art, considerable effort has been directed to enhancing the temperature control capabilities of enclosure and support racks for electronic device assemblies. Some examples of this design effort is found in the following U.S. Patents.

In U.S. Pat. No. 5,894,407 (Aakalu et al.), issued Apr. 13, 1999, and U.S. Pat. No. 5,769,159 (Yun), issued Jun. 23, 1998, enclosures for electronic assemblies are provided with air passageways which are adjustable in size. The size adjustment takes place passively and as a function of the temperature of air flowing through the passageways. These systems are effective in controlling an overall temperature of an entire electronics assembly. They are not, however, capable of controlling the temperature of a single device or a subset of devices at a temperature different from other devices in the entire assembly.

In U.S. Pat. No. 5,101,320 (Bhargava et al.), issued Mar. 31, 1992, an enclosure is constructed with a series of parallel supports with air-flow channels between each support. The airflow channels are adapted to remain closed if there is no circuit board on an adjacent support. This arrangement provides enhanced cooling for every circuit board in an enclosure. But, it does not provide for any individualized cooling for any particular circuit board or any particular sub-set of electronic devices.

In U.S. Pat. No. 4,739,444 (Zushi et al.), issued Apr. 19, 1988, an enclosure is structured so that air cooling channels are provided with flow restrictors. Each flow restrictor is a plate with a unique pattern of air passage holes. Each flow restrictor is produced to optimize air flow through its corresponding channel on the basis of the geometry and air-flow resistance of the electronic devices that are adjacent that channel. This arrangement provides individualized cooling control for particular circuit boards, but the system cannot accommodate any rearrangement or changes in the nature of the circuit boards which are placed in the enclosure. In other words, the enclosure design does not readily accommodate upgrades of an electronic system.

Present day electronic systems are manufactured and sold in a very competitive economic climate. Consequently, there is a need to provide electronic assemblies in cabinets and enclosures which can be produced at low cost. This translates into a need for enclosures that is made in a universal style which accommodates a wide combination of electronic devices. Additionally, these low cost universal enclosures must readily accommodate upgrades and modifications of the electronic systems.

Heretofore, there has been no enclosure design which has provided this desirable universality along with individualized cooling control capability. It is important, therefore to devise system for supporting and accurately maintaining temperature of a wide range of combinations of electronic devices in low cost enclosures.

The present invention meets these goals.

SUMMARY OF THE INVENTION

The present invention is generally directed in an apparatus aspect to an enclosure for an assembly of electronic devices mounted on boards. The enclosure comprises a plurality of support members arranged to support the boards with air channels therebetween. Each of the air channels is connected to a source of cooling air at a first end thereof. Each of the air channels has a thermally sensitive gate at a second end thereof. This arrangement permits individualized cooling control of a wide range of electronic devices housed in the enclosure.

The present invention is generally directed in a method aspect to a method for maintaining a desired operating temperature for electronic devices mounted on boards. The method comprises the steps of placing a plurality of the boards into an alignment which produces air channels therebetween, producing a pressure gradient of cooling air at a first end of each of the air channels, sensing the temperature of the air at a second end of each of the air channels and releasing the cooling air at the second end of each of the channels at a variable rate. The rate is controlled as a function of the temperature of the air at the second end of the channel.

Viewed from a first apparatus aspect, the present invention is directed to apparatus comprising a support frame adapted to support a plurality of heat generating elements while leaving an air channel between adjacent heat generating members and a plurality of thermally sensitive air-flow restrictors. The support frame defines first and second ends of each air channel. The first ends of each channel are adapted to be in communication with a source of air. The plurality of thermally sensitive flow restrictors have a separate one of each positioned at the second of each air channel. Each thermally sensitive air-flow restrictor is adapted to release from a low level portion to a high portion of the cooling air at the second end of each of the air channels with the released portion being controlled as a function of the temperature of the air at the second end of the channel.

Viewed from a second apparatus aspect, the present invention is directed to apparatus comprising a support frame adapted to support a plurality of heat generating elements while leaving an air channel between adjacent heat generating members and a plurality of thermally sensitive air-flow restrictors. The support frame defines first and second ends of each air channel. The first ends of each channel are adapted to be in communication with a source of air. The plurality of thermally sensitive air-flow restrictors have a separate one of each positioned at the second of each air channel. Each thermally sensitive air-flow restrictor is adapted to essentially cover the second end of a channel if a first preselected amount of heat or less is detected in that channel or to partially or completely open the second end of the channel if more than the first preselected amount of heat is detected in the channel such that individualized cooling control can be achieved for each heat generating member placed in the support frame.

Viewed from a third apparatus aspect, the present invention is directed to apparatus comprising an enclosure for housing a plurality of electronic devices mounted on boards. The enclosure comprises a plurality of support members arranged to support the boards with air channels therebetween and a plurality of thermally sensitive air-flow restrictors. Each of the air channels is in communication with a source of cooling air at a first end thereof. The plurality of thermally sensitive air-flow restrictors have a separate one located at a second end thereof of each air channel such that individualized cooling control of a wide range of electronic devices housed in the enclosure is achieved.

Viewed from a first method aspect, the present invention is directed to a method for maintaining a desired operating temperature of heat generating elements within an enclosure with the heat generating elements being spaced apart so as to have air channels between adjacent heat generating elements. The method comprises the steps of: producing a pressure gradient of cooling air at a first end of each of the air channels; sensing the temperature in the vicinity of the second end of each air channel; and releasing a portion of the cooling air at the second end of each of the air channels with the released portion being controlled as a function of the temperature of the air at the second end of the channel.

Viewed from a second method aspect, the present invention is directed to a method for maintaining a desired operating temperature for electronic devices mounted on boards. The method comprises the steps of: placing a plurality of the boards into an alignment which produces air channels therebetween; producing a pressure gradient of cooling air at a first end of each of the air channels; sensing the temperature of the air at a second end of each of the air channels; and releasing a portion of the cooling air at a second end of each of the channels with the portion being controlled as a function of the temperature of the air at the second end of the channel.

Viewed from a third method aspect, the present invention is directed to a method for maintaining a desired operating temperature of electronic devices mounted on boards within an enclosure with the boards being spaced apart so as to have air channels between adjacent boards. The method comprises the steps of: producing a pressure gradient of cooling air at a first end of each of the air channels; sensing the temperature of the air at a second end of each of the air channels; sensing the temperature in the vicinity of the second end of each air channel; and releasing a portion of the cooling air at the second end of each of the air channels with the released portion being controlled as a function of the temperature of the air at the second end of the channel.

The invention will be better understood from the following detailed description taken in consideration with the accompanying drawings and claims.

The drawings are not necessarily to scale.

DETAILED DESCRIPTION

Figure 1:
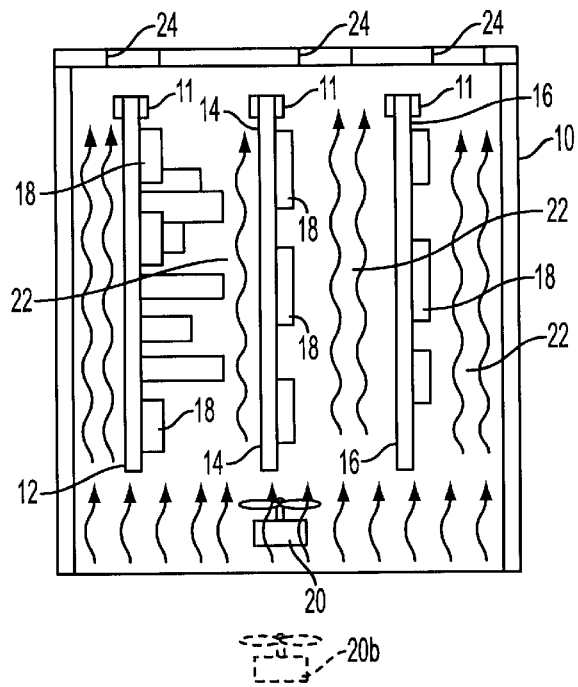
FIG. 1 is a schematic cross-sectional view of a enclosure for electronic components constructed in accordance with the prior art.

Referring now to FIG. 1, there is shown a supporting enclosure 10 constructed in accordance with the prior art. As is typical in the prior art, a series of supports 11 hold a collection of circuit boards 12, 14 and 16 in a parallel relationship. Each of the circuit boards has various heat-producing electronic components 18 mounted thereon. An air-moving device such as a fan 20 is employed to move air past the components 18, through air-flow channels 22 between the circuit boards 12, 14, and 16 and then through various exit ports 24 formed in the enclosure 10.

The spacing of the circuit boards 12, 14 and 16 relative to each other, the height of the components 18, and the presence or absence of heat sinks determines the resistance to air-flow through each of the channels 22. In this typical, prior art system, the fan 20 produces a fixed volume of air flow. Consequently, pressure drop in all of the channels 22 determines the air velocity within any specific channel. In practice, a single rate of air-flow within the enclosure 10 is chosen, ostensibly to optimize cooling for specific circuit boards mounted in specific locations. However, a single air-flow rate inherently results in a compromised cooling arrangement because all of the circuit boards are not the same.

Each board has an inherent pressure drop caused by its specific set of components. Changing the type of board in any slot can have extreme consequences on the air-flow within the enclosure 10. This, of course, has an effect on the individual temperature of each of the components 18.

During the lifetime of one of the enclosures 10, a manufacturer may offer new boards with higher electrical performance. These new boards may change the air-flow within the enclosure 10. This changed air-flow may produce unacceptably high component temperatures. For example, assume the enclosure 10 has twenty equal-sized slots for circuit boards. And assume further that one slot has a 100 watt board installed while all of the others have 50 watt boards. If all of the boards have equal air-flow resistance and the fan 20 is installed to cool 50 watt boards, then the 50 watt boards will remain cool. The 100 watt board will probably overheat. Conversely, if the fan 20 is sized for 100 watt boards, then the 50 watt boards will be over cooled.

The geometric configuration of components on the boards adds another dimension to the cooling problem. Assume that all the boards in FIG. 1 are 100 watt boards and that the components 18 on board 12 produce twice the air-flow resistance as those on boards 14 and 16. An air-flow velocity of 1.0 m/s will result in the exit temperature increase of air at board 12 being 23.4° C. while the exit temperature increase of air at boards 14 and 16 will be 11.7° C.

Figure 2:
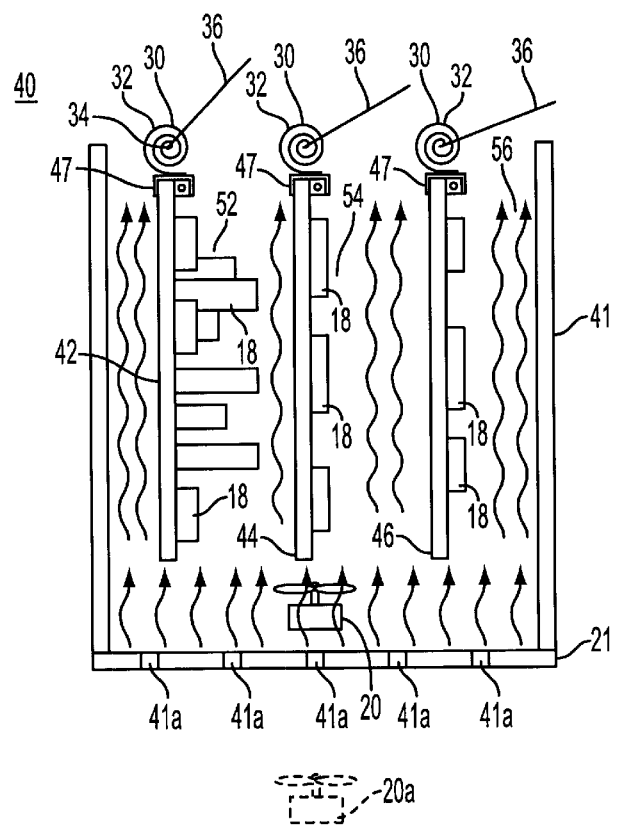
FIG. 2 is a schematic cross-sectional view of a enclosure having a plurality of thermally sensitive air-flow restrictors and housing boards containing electrical components in accordance with the present invention.
Figure 3:
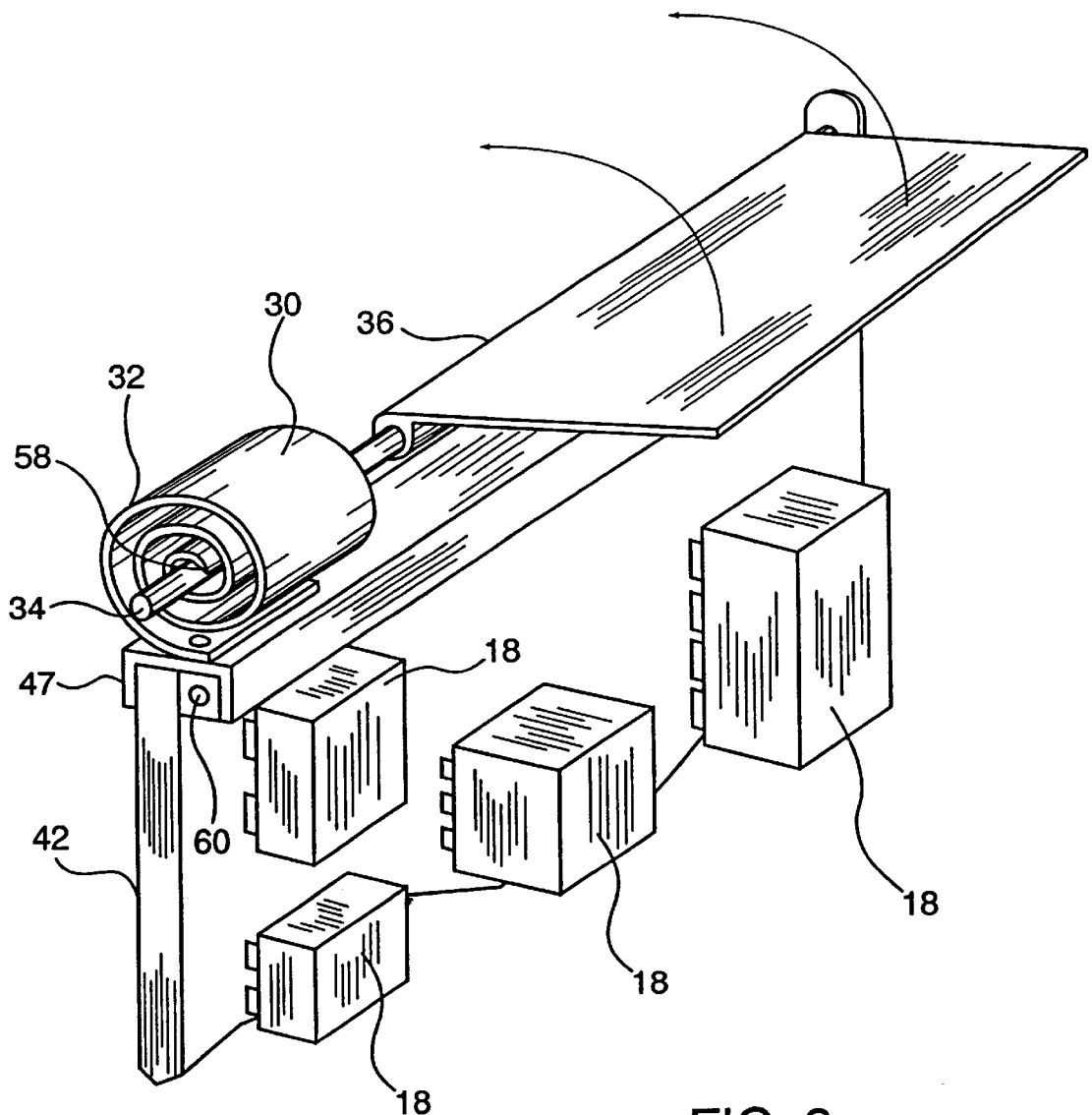
FIG. 3 is a perspective enlarged view of an air-flow restrictor and a board containing electronic components of FIG. 2.

Referring now to FIG. 2, there is a cross-sectional view of apparatus 40 in accordance with the present invention. Apparatus 40 comprises a support frame (enclosure) having supports 47 and temperature sensitive air-flow restrictors 30 and is shown housing (containing) a plurality of circuit boards (aka as printed circuit boards) of which three (42, 44, and 46) are shown. Each of the circuit boards 42, 44, and 46 is shown containing a plurality of electrical components 18 which generate heat when same are operating. FIG. 3 shows an enlarged three dimensional view of one of the thermally sensitive air-flow restrictors 30 and a portion of a circuit board 42 of FIG. 2. In a preferred embodiment, the air-flow restrictor 30 is comprised of a bimetallic coil 32, an axial operating rod 34 and a gate 36.

The circuit boards 42, 44 and 46 are arranged on supports 47 in parallel alignment with air-flow channels 52, 54 and 56, respectively, formed adjacently to each of the boards. Each of the air-flow channels has one of the air-flow restrictors 30 of FIGS. 2 and 3 positioned at an output (second) end thereof. On a lower surface 21 of support frame 40 is mounted a fan 20. The lower surface 21 of support frame 40 defines a plurality of openings 41a therethrough which facilitate air flow from outside of support member 40 entering same and passing through first ends of air-flow channels 52, 54, and 56 and over circuit boards 42, 44, and 46 as same passes through channels 42, 54, and 56. A fan 20a (shown in dashed lines), shown below support member 40, can be substituted for fan 20 or a fan 20b (shown in dashed lines), shown above temperature sensitive air-flow restrictors 30, can be substituted for fan 20. An advantage of having fan 20b above the restrictors 30 is that any heat from the fan will be essentially be isolated from the interior of the support member 40 and thus not heat up the electrical components 18.

Each of the gates 36 of restrictor 30 opens and closes in response to increases or decreases in temperature of the air reaching the bimetallic coil 32 of restrictor 30. These air temperature changes develop in response to heat dissipation of the components 18 on the circuit boards 42, 44 and 46, according to the following equation:

$$\Delta T = q/mc_p s$$

where:

$\Delta T$=temperature increase(° C.)

q=power dissipation (W)

m=mass flow (kg/s)

$c_p$=specific heat (J/kg K)

s=air density (kg/cm³)

The angular opening of each of the gates 36 is related to the temperate change by the equation:

$$\phi = F \Delta T L / t$$

where:

$\phi$=angular deflection (radians)

F =flexivity $\Delta T$=temperature change (° C.)

L=free deflection length (m)

t=composite thickness (m)

Referring again to FIG. 3, it can be seen that angular deflection of the bimetallic coil 32 increases as temperature increases. A center or free end 58 of the coil 32 is attached to the operating rod 34 which is attached to the gate 36. A fixed end 60 of the coil 32 is attached to the support 47. Consequently, angular deflection of the coil 32 produces a corresponding angular movement of the gate 36.

This feature of the present invention controls the temperature of air that flows past each of the circuit boards 42, 44 and 46 of FIG. 2. If one of the boards produces a higher air temperature than that of an adjacent board, then its associated gate 36-opens further and permits a greater flow of air. This produces greater cooling and a consequent partial closure of the gate 36. This inward and outward movement of the gate 36 very quickly produces a balancing of air flow across each of the circuit boards. This balancing of air flow produces a steady state condition in which each of the circuit boards is provided with a cooling environment that is appropriate for that board.

Thus, individualized control of cooling is achieved even though the boards are populated with widely varying collections of components which produce varying amounts of heat and varying resistance to air-flow.

Each of the flow restrictors 30, is constructed to maintain a selected air temperature within its corresponding channel. The enclosure 41 can be moved to different locations with widely varying environments The temperature control mechanism of the present invention maintains a consistent steady state operating temperature for each of the circuits boards, independently of the environment in which the enclosure is located.

Additionally, upgrades and modifications of the electronic equipment in the enclosure 41 can be readily made. If a circuit board with a higher heat dissipation is placed adjacent one of the air-flow channels, the associated air-flow restrictor 30 simply opens further. This permits more air-flow and a corresponding increase in heat transfer from the new board. A proper balance of air-flow and heat dissipation develops and the new board operates at the desired temperature.

In order to utilize this upgrading and modification feature of the present invention, it is course necessary to assure that the air channels and flow gates are of suitable size to accommodate a wide range of air-flow rates. The range of air-flow rates must be great enough to provide for proper cooling of a variable selection of electronic device combinations which may be inserted or interchanged throughout the useful lifetime of the enclosure.

It is to be appreciated and understood that the specific embodiments of the invention are merely illustrative of the general principles of the invention. Various modifications may be made by those skilled in the art which are consistent with the principles set forth. For examples, gates can be made to move in response to many different configurations of bimetallic or other temperature sensitive objects.

What is claimed is:

1. An apparatus comprising:
    a support frame adapted to support a plurality of heat generating elements while leaving an air channel between adjacent heat generating elements;
    the support frame defining first and second ends of each air channel;
    the first ends of each air channel being adapted to be in communication with a source of air; and
    a plurality of thermally sensitive air-flow restrictors, a separate one of the plurality of thermally sensitive air-flow restrictors being positioned at the second end of each air channel,
    each of the plurality of thermally sensitive air-flow restrictors being adapted to essentially cover the second end of a respective air channel if a first amount of heat or less is detected in the respective air channel, to partially open the second end of the respective air channel if a second amount of heat is detected in the respective air channel, and to completely open the second end of the respective air channel if a third amount of heat or more is detected in the respective air channel, the second amount of heat being greater than the first amount of heat and the third amount of heat being greater than the second amount of heat, such that individualized cooling control can be achieved for each heat generating element in the support frame.

2. The apparatus of claim 1 further comprising an air moving device in communication with the first ends of the air channels.

3. The apparatus of claim 2 wherein the air moving device is a fan.

4. The apparatus of claim 1 further comprising an air moving device located adjacent the thermally sensitive air-flow restrictors.

5. The apparatus of claim 1 wherein each of the thermally sensitive air-flow restrictors comprises:
    a bimetallic coil having an inner end and an outer end;
    an axial rod attached to the inner end of the coil;
    a gate member attached to the rod; and
    the outer end of the coil being attached to a fixed portion of the support member such that changes in temperature of the coil produce angular deflection of the gate member.

6. An apparatus comprising:
    a support frame adapted to support a plurality of heat generating elements while leaving an air channel between adjacent heat generating elements;
    the support frame defining first and second ends of each air channel;
    the first ends of each air channel being adapted to be in communication with a source of air;
    a plurality of thermally sensitive air-flow restrictors, a separate one of the plurality of thermally sensitive air-flow restrictors being positioned at the second end of each air channel; and
    each of the plurality of thermally sensitive air-flow restrictors being adapted to essentially cover the second end of a respective air channel if a first amount of heat or less is detected in the respective air channel, to partially open the second end of the respective air channel if a second amount of heat is detected in the respective air channel, and to completely open the second end of the respective air channel if a third amount of heat is detected in the respective air channel, the second amount of heat being greater than the first amount of heat and the third amount of heat being greater than the second amount of heat, such that individualized cooling control can be achieved for each heat generating element in the support frame.

7. An enclosure for housing a plurality of electronic devices mounted on boards, said enclosure comprising:
    a plurality of support members arranged to support the boards with air channels therebetween;
    each of the air channels being in communication with a source of cooling air at a first end thereof; and
    a plurality of thermally sensitive air-flow restrictors, each of the plurality of thermally sensitive air-flow restrictors being located at a second end of a respective air channel and adapted to essentially cover the second end of the respective air channel if a first amount of heat or less is detected in the respective air channel, to partially open the second end of the respective air channel if a second amount of heat is detected in the respective air channel, and to completely open the second end of the respective air channel if a third amount of heat or more is detected in the respective air channel, the second amount of heat being greater than the first amount of heat and the third amount of heat being greater than the second amount of heat, such that individualized cooling control of a wide range of electronic devices housed in the enclosure is achieved.

8. The enclosure of claim 7 wherein:
    the air channels and thermally sensitive air-flow restrictors are of suitable size to accommodate a range of air-flow rates; and
    the range of air-flow rates is great enough to provide for proper cooling of a variable selection of electronic device combinations which may be inserted or interchanged throughout the useful lifetime of the enclosure.

9. The enclosure of claim 7 wherein each of the thermally sensitive air-flow restrictors comprises:
    a bimetallic coil having an inner end and an outer end;
    an axial rod attached to the inner end of the coil;
    a gate member attached to the rod; and
    the outer end of the coil being attached to a fixed portion of the enclosure, whereby changes in temperature of the coil produce angular deflection of the gate member.

10. A method for maintaining a desired operating temperature of heat generating elements within an enclosure with the heat generating elements being spaced apart so as to have air channels between adjacent heat generating elements, said method comprising the steps of:

producing a pressure gradient of cooling air at a first end of each of the air channels;

sensing the temperature in the vicinity of a second end of each of the air channels; and variably releasing a portion of the cooling air at the second end of each of the air channels through the use of a plurality of thermally sensitive air-flow restrictors, each of the plurality of thermally sensitive air-flow restrictors being located at the second end of a respective air channel and adapted to essentially cover the second end of the respective air channel if a first amount of heat or less is detected in the respective air channel, to partially open the second end of the respective air channel if a second amount of heat is detected in the respective air channel, and to completely open the second end of the respective air channel if a third amount of heat or more is detected in the respective air channel, the second amount of heat being greater than the first amount of heat and the third amount of heat being greater than the second amount of heat.

11. A method for maintaining a desired operating temperature for electronic devices mounted on boards comprising the steps of:

placing a plurality of the boards into an alignment which produces air channels therebetween;

producing a pressure gradient of cooling air at a first end of each of the air channels;

sensing the temperature of the air at a second end of each of the air channels; and variably releasing a portion of the cooling air at the second end of each of the air channels through the use of a plurality of thermally sensitive air-flow restrictors, each of the plurality of thermally sensitive air-flow restrictors being located at the second end of a respective air channel and adapted to essentially cover the second end of the respective air channel if a first amount of heat or less is detected in the respective air channel, to partially open the second end of the respective air channel if a second amount of heat is detected in the respective air channel, and to completely open the second end of the respective air channel if a third amount of heat or more is detected in the respective air channel, the second amount of heat being greater than the first amount of heat and the third amount of heat being greater than the second amount of heat.

12. A method for maintaining a desired operating temperature of electronic devices mounted on boards within an enclosure with the boards being spaced apart so as to have air channels between adjacent boards, said method comprising the steps of:

producing a pressure gradient of cooling air at a first end of each of the air channels;

sensing the temperature of the air at a second end of each of the air channels; and variably releasing a portion of the cooling air at the second end of each of the air channels through the use of a plurality of thermally sensitive air-flow restrictors, each of the plurality of thermally sensitive air-flow restrictors being located at the second end of a respective air channel and adapted to essentially cover the second end of the respective air channel if a first amount of heat or less is detected in the respective air channel, to partially open the second end of the respective air channel if a second amount of heat is detected in the respective air channel, and to completely open the second end of the respective air channel if a third amount of heat or more is detected in the respective air channel, the second amount of heat being greater than the first amount of heat and the third amount of heat being greater than the second amount of heat.

* * * * *